United States Patent
Gilman et al.

(10) Patent No.: US 10,362,685 B2
(45) Date of Patent: Jul. 23, 2019

(54) PROTECTIVE COATING FOR PRINTED CONDUCTIVE PATTERN ON PATTERNED NANOWIRE TRANSPARENT CONDUCTORS

(71) Applicant: 3M INNOVATIVE PROPERTIES COMPANY, St. Paul, MN (US)

(72) Inventors: Ann M. Gilman, Woodbury, MN (US); Mikhail L. Pekurovsky, Bloomington, MN (US); Matthew S. Stay, Minneapolis, MN (US); Shawn C. Dodds, St. Paul, MN (US); Daniel J. Theis, Mahtomedi, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 316 days.

(21) Appl. No.: 15/025,696

(22) PCT Filed: Sep. 22, 2014

(86) PCT No.: PCT/US2014/056768
§ 371 (c)(1),
(2) Date: Mar. 29, 2016

(87) PCT Pub. No.: WO2015/047944
PCT Pub. Date: Apr. 2, 2015

(65) Prior Publication Data
US 2016/0249461 A1    Aug. 25, 2016

Related U.S. Application Data

(60) Provisional application No. 61/884,954, filed on Sep. 30, 2013.

(51) Int. Cl.
*H05K 3/28* (2006.01)
*G06F 3/041* (2006.01)
(Continued)

(52) U.S. Cl.
CPC ......... *H05K 3/285* (2013.01); *G02F 1/13338* (2013.01); *G06F 3/041* (2013.01);
(Continued)

(58) Field of Classification Search
CPC ........ H01L 29/0669; H01L 21/823871; H05K 1/097
See application file for complete search history.

(56) References Cited

U.S. PATENT DOCUMENTS

| 3,660,088 A | 5/1972 | Lundsager |
| 6,975,067 B2 | 12/2005 | McCormick |

(Continued)

FOREIGN PATENT DOCUMENTS

| CN | 102120920 A | 7/2011 |
| JP | S42-3345 B | 10/1970 |

(Continued)

OTHER PUBLICATIONS

Love, "Self-Assembled Monolayers of Thiolates on Metals as a Form of Nanotechnology," Chemical Reviews, 2005, vol. 105, pp. 1103-1169.

(Continued)

*Primary Examiner* — Zandra V Smith
*Assistant Examiner* — John M Parker
(74) *Attorney, Agent, or Firm* — James A. Baker

(57) ABSTRACT

A method for making an electronic assembly includes applying a protective layer including an organosulfur compound to at least a portion of a patterned conductive interconnect circuit, wherein the conductive interconnect circuit overlies at least a portion of a conductive layer on a substrate, and wherein the conductive layer includes nanowires; and engaging an electrical contact of an electronic component with the protective layer to electrically connect the electronic component and the patterned conductive layer.

15 Claims, 4 Drawing Sheets

(51) Int. Cl.
    G02F 1/1333      (2006.01)
    H05K 1/02        (2006.01)
    H05K 3/02        (2006.01)
    H05K 3/06        (2006.01)
    H01L 29/06       (2006.01)
    H01L 21/8238     (2006.01)
    H05K 1/09        (2006.01)
    B82Y 15/00       (2011.01)
    B82Y 40/00       (2011.01)

(52) U.S. Cl.
    CPC ........... *H05K 1/0296* (2013.01); *H05K 3/027* (2013.01); *H05K 3/06* (2013.01); *B82Y 15/00* (2013.01); *B82Y 40/00* (2013.01); *G02F 2001/133302* (2013.01); *G06F 2203/04103* (2013.01); *G06F 2203/04107* (2013.01); *H01L 21/823871* (2013.01); *H01L 29/0669* (2013.01); *H05K 1/097* (2013.01); *H05K 2203/1377* (2013.01); *Y10S 977/762* (2013.01); *Y10S 977/89* (2013.01); *Y10S 977/956* (2013.01)

(56)          References Cited

U.S. PATENT DOCUMENTS

| 8,049,333 B2    | 11/2011 | Alden          |              |
| 8,179,381 B2    | 5/2012  | Frey           |              |
| 2004/0152240 A1*| 8/2004  | Dangelo        | B82Y 10/00   |
|                 |         |                | 438/122      |
| 2004/0265492 A1 | 12/2004 | Free et al.    |              |
| 2008/0095985 A1 | 4/2008  | Frey           |              |
| 2008/0158181 A1 | 7/2008  | Hamblin et al. |              |
| 2008/0307991 A1*| 12/2008 | Tanaka         | H05K 3/182   |
|                 |         |                | 101/492      |
| 2009/0129004 A1 | 5/2009  | Gruner         |              |
| 2010/0258968 A1 | 10/2010 | Zu             |              |
| 2011/0232954 A1 | 9/2011  | Sirringhaus et al. |          |
| 2011/0297642 A1 | 12/2011 | Allemand       |              |
| 2012/0177897 A1 | 7/2012  | Jablonski      |              |
| 2015/0017457 A1 | 1/2015  | Mizuno et al.  |              |

FOREIGN PATENT DOCUMENTS

| WO | WO 2007-022226    | 2/2007  |
| WO | WO 2009/108771 A2 | 9/2009  |
| WO | WO 2011/106438    | 9/2011  |
| WO | WO 2012/040637 A2 | 3/2012  |
| WO | WO 2012145157 A1  | 10/2012 |
| WO | WO 2013-095971    | 6/2013  |
| WO | WO 2013/133272 A1 | 9/2013  |
| WO | WO 2014-088950    | 6/2014  |
| WO | WO 2015/017143 A1 | 2/2015  |

OTHER PUBLICATIONS

Sun, "Polyol Synthesis of Uniform Silver Nanowires: A Plausible Growth Mechanism and the Supporting Evidence", Nanoletters, 2003, vol. 3, No. 7, pp. 955-960.

Sun, "Uniform Silver Nanowires Synthesis by Reducing AgNO3 with Ethylene Glycol in the Presence of Seeds and Poly(Vinyl Pyrrolidone)", Chem. Mater., 2002, vol. 14, pp. 4736-4745.

Ulman, "Formation and Structure of Self-Assembled Monolayers," Chemical Reviews, 1996, vol. 96, pp. 1533-1554.

International Search report for PCT International Application No. PCT/US2014/056768 dated Dec. 22, 2014, 4 pages.

\* cited by examiner

PROTECTIVE COATING FOR PRINTED CONDUCTIVE PATTERN ON PATTERNED NANOWIRE TRANSPARENT CONDUCTORS

BACKGROUND

Transparent conductors are utilized on touch screens to enable human touch or gesture interactions with computers, smart phones, and other graphics based screen interfaces. Nanowires are one material suitable for making the transparent conductors. For example, PCT publication WO 2007/022226, entitled "Nanowire-Based Transparent Conductors" discloses a nanowire material sold by Cambrios Technologies Corporation that can be patterned into a suitable grid to enable the production of touch screens for use with computers.

3M File No. 69879US002 describes a process for efficient production of touch screen devices in which a conductive material is patterned (e.g., printed) into electrical traces on a substrate. This process can be performed in a roll-to-roll process where the substrate is unwound, converting operations such as printing and drying/curing are performed, and then the patterned substrate is wound again into a roll for further transport and processing.

SUMMARY

The patterned conductive material formed by the processes described in U.S. Pat. No. 10,254,786 can have applied thereon patterned interconnect circuit layers made from, for example, conductive inks. The present disclosure is directed to protective overcoat layers for the interconnect circuit layers that can prevent damage to the interconnect circuit layers. The protective overcoat layers can prevent damage to the interconnect circuit layers during processing of the interconnect circuit layers, or during subsequent bonding steps in which the interconnect circuit layers are connected to an electronic circuit component to produce an electronic assembly such as, for example, a touch sensor for use in a touch-screen display. The present disclosure is further directed to electronic devices such as, for example, touch-screen displays, constructed using these interconnection processes.

Listing of Embodiments

A. A method for making an electronic assembly, including:
 applying a protective layer including an organosulfur compound to at least a portion of a patterned conductive interconnect circuit, wherein the conductive interconnect circuit is electrically connected to a conductive layer on a substrate, and wherein the conductive layer comprises nanowires; and
 engaging an electrical contact of an electronic component with the protective layer to electrically connect the electronic component and the patterned conductive layer.
B. The method of embodiment A, wherein the organosulfur compound is selected from at least one of alkyl thiols and aryl thiols.
C. The method of any of embodiments A-B, wherein the organosulfur compound is an alkyl thiol.
D. The method of any of embodiments A-C, wherein the patterned conductive layer is transparent.
E. A method, including:
 coating a substrate with a conductive layer including nanowires;
 applying a pattern of a conductive interconnect material on the conductive layer to generate on the substrate one or more first regions of exposed conductive layer and one or more second regions of conductive interconnect material;
 hardening or curing the conductive interconnect material to form a patterned interconnect circuit;
 applying on at least a portion of the patterned interconnect circuit a protective layer forming composition including an organosulfur compound;
 overcoating the patterned interconnect circuit and the protective layer forming composition with a liquid strippable polymer layer-forming composition;
 hardening or curing the strippable polymer layer-forming composition to form a strippable polymer layer;
 peeling the strippable polymer layer from the substrate; and
 removing the exposed conductive layer from the substrate in the one or more first regions of the substrate to form a patterned conductive layer on the substrate, wherein the patterned conductive layer is at least partially overlain by the patterned interconnect circuit, and the patterned interconnect circuit is at least partially overlain by the protective layer.
F. The method of embodiment E, further including drying the protective layer-forming composition to form a protective layer prior to overcoating with the strippable polymer layer forming composition.
G. A method, including:
 coating a substrate with a conductive layer including nanowires;
 applying a pattern on the conductive layer with a conductive interconnect material to generate on the substrate one or more first regions of exposed conductive layer and one or more second regions of conductive interconnect material;
 hardening or curing the conductive interconnect material to form a patterned interconnect circuit;
 overcoating the pattern with a liquid strippable polymer layer-forming composition, wherein the strippable polymer layer-forming composition includes an organosulfur compound;
 hardening or curing the strippable polymer layer-forming composition to form a strippable polymer layer;
 peeling the strippable polymer layer from the substrate; and
 removing the exposed conductive layer from the substrate in the one or more first regions of the substrate to form a patterned conductive layer on the substrate, wherein the patterned conductive layer is at least partially overlain by the patterned interconnect circuit, and the patterned interconnect circuit is at least partially overlain by a protective layer including the organosulfur compound.
H. An electronic assembly made according to any of the embodiments A-G.
I. An electronic assembly, including:
 a substrate including thereon a pattern of conductive nanowires, wherein the conductive nanowires are electrically connected to a conductive interconnect circuit, and wherein at least a portion of the conductive interconnect circuit is overlain by a protective layer including an organosulfur compound; and
 an electrical contact of an electronic component in contact with the protective layer.
J. The electronic assembly of embodiment I, further including a conductive layer between the substrate and the electronic component.
K. The electronic assembly of embodiment J, wherein the conductive layer includes a conductive adhesive.

L. The electronic assembly of any of embodiments I-K, wherein the electronic component comprises a flexible circuit.

M. The electronic assembly of any of embodiments I-L, wherein the organosulfur compound is selected from at least one of alkyl thiols and aryl thiols.

N. The electronic assembly of any of embodiments I-M, wherein the organosulfur compound is an alkyl thiol.

O. A touch screen display including:
  a liquid crystal display; and
  an electronic assembly including:
    a glass substrate on the liquid crystal display, wherein the glass substrate comprises thereon a pattern of conductive nanowires, wherein the conductive nanowires are electrically connected to a patterned conductive interconnect circuit, and wherein at least a portion of the interconnect circuit is overlain by a protective layer including an organosulfur compound; and
    an electrical contact of an flexible circuit in contact with the protective layer; and
    a flexible transparent surface overlying the electronic assembly.

P. The display of embodiment O, further including a conductive layer between the substrate and the flexible circuit.

Q. The display of embodiment P, wherein the conductive layer includes a conductive adhesive.

R. The display of any of embodiments O-Q, wherein the organosulfur compound is selected from at least one of alkyl thiols and aryl thiols.

S. The display of any of embodiments O-R, wherein the organosulfur compound is an alkyl thiol.

The terms "about" or "approximately" with reference to a numerical value, property, or characteristic, means+/−five percent of the numerical value, property, characteristic, but also expressly includes any narrow range within the +/−five percent of the numerical value or property or characteristic as well as the exact numerical value. For example, a temperature of "about" 100° C. refers to a temperature from 95° C. to 105° C., inclusive, but also expressly includes any narrower range of temperature or even a single temperature within that range, including, for example, a temperature of exactly 100° C.

The term "substantially" with reference to a property or characteristic means that the property or characteristic is exhibited to within 98% of that property or characteristic, but also expressly includes any narrow range within the two percent of the property or characteristic, as well as the exact value of the property or characteristic. For example, a substrate that is "substantially" transparent refers to a substrate that transmits 98-100%, inclusive, of the incident light.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like symbols in the drawing are directed to like elements.

DETAILED DESCRIPTION

Figure 1:
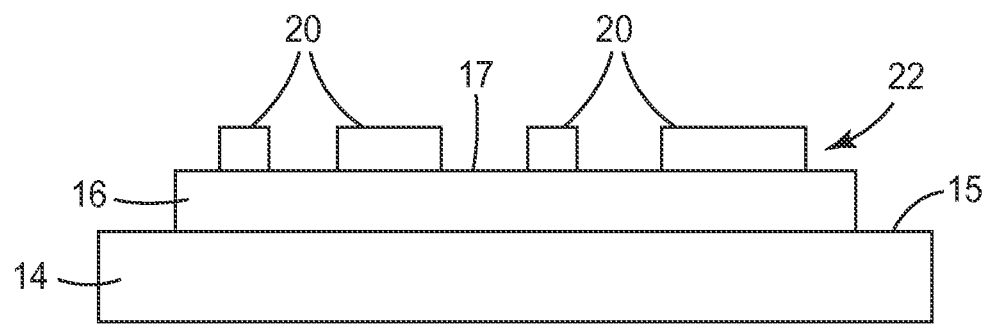
FIG. 1 is a schematic, cross-sectional view of a conductive nanowire layer on a substrate, wherein the conductive nanowire layer is at least partially overlain by a patterned interconnect circuit layer.

Referring now to FIG. 1, a substrate 14 is coated with a conductive layer 16. There are many conductive materials that could be used in the conductive layer 16, including, but not limited to, metals (e.g., open mesh patterns) and metal oxides, such as indium tin oxide (ITO), conductive polymers, such as poly(3,4-ethylenedioxythiophene (PEDOT), conductive particles in a binder, or metal nanowires (for example, the materials described in U.S. Pat. No. 8,049,333.) These materials must meet a variety of desired specifications for conductivity and optical transparency.

There are several approaches to patterning these conductive materials for use in electronic assemblies such as, for example, touch sensors. One approach would be to print the material directly, from a dispersion or ink, using standard printing processes such as ink-jet, gravure, flexographic, or screen printing. This approach is straight forward in that it is able to produce a pattern in one step, with minimal waste. However, variations in the print thickness due to defects such as ribbing and pinholes may produce unacceptable variations in conductivity, as well as negatively impacting the optics of the sensor. An alternative approach is to uniformly coat the surface of the substrate with the conductive material, such as a nanowire material, by forming a substantially continuous nanowire layer and then selectively removing portions of the nanowire layer to create the desired patterned (subtractive patterning). Selective removal is often accomplished either by wet chemical etching or laser ablation. In both cases, one can be limited both by the width of the substrate that can be processed, which is typically less than 30" wide, and by the throughput, which is typically on the order of 1-10 ft/min or less. Also, both etching and laser ablation patterning can present certain process control challenges, related to management of chemical kinetic or photolytic phenomena. As such, a method of subtractive patterning a nanowire layer that does not require etching or laser ablation is needed.

The conductive layer 16 is substantially continuous over at least a portion of a first major surface 15 of the substrate 14 and desirably over at least 50%, 60%, 70%, 80%, or 90% of the area of the first major surface. The conductive layer 16 may be applied in discrete blocks or rectangles, leaving uncoated substrate areas between them, with the blocks or rectangles having a size similar to the overall size of the intended touch screen being produced. By "substantially continuous" it is meant the nanowires are applied at a sufficient density to render the surface of the substrate conductive, it being recognized that a nanowire layer will include individual wires with openings or spaces between them as shown in, for example, FIG. 15B in WO 2007/022226.

Coating the conductive layer 16 on the substrate 14 can be achieved by printing into discrete traces or patterns by, for example, a flexographic or gravure printing process, leaving uncoated substrate areas between the discrete traces or patterns. Typically, a uniform thickness and continuous coating of conductive material is applied over at least some portion of the substrate, but not necessarily the entire width or length of the substrate. For example, the middle portion of the substrate could be coated while a strip or margin along each edge is left uncoated.

In one embodiment, which is not intended to be limiting, the conductive nanowire layer 16 includes conductive nanowires. In this application, the term nanowire refers to conductive metal or non-metallic filaments, fibers, rods, strings, strands, whiskers, or ribbons having high aspect ratios (e.g., higher than 10). Examples of non-metallic conductive nanowires include, but are not limited to, carbon nanotubes (CNTs), metal oxide nanowires (e.g., vanadium pentoxide), metalloid nanowires (e.g. silicon), conductive polymer fibers and the like.

As used herein, "metal nanowire" refers to a metallic wire including elemental metal, metal alloys or metal compounds (including metal oxides). At least one cross sectional dimension of the metal nanowire is less than 500 nm, or less than 200 nm, and more preferably less than 100 nm. As noted, the metal nanowire has an aspect ratio (length:width) of greater than 10, preferably greater than 50, and more preferably greater than 100. Suitable metal nanowires can be based on any metal, including without limitation, silver, gold, copper, nickel, and gold-plated silver.

The metal nanowires can be prepared by known methods in the art. In particular, silver nanowires can be synthesized through solution-phase reduction of a silver salt (e.g., silver nitrate) in the presence of a polyol (e.g., ethylene glycol) and polyvinyl pyrrolidone). Large-scale production of silver nanowires of uniform size can be prepared according to the methods described in, e.g., Xia, Y. et al., *Chem. Mater.* (2002), 14, 4736-4745, and Xia, Y. et al., *Nanoletters* (2003) 3(7), 955-960. More methods of making nanowires, such as using biological templates, are disclosed in WO 2007/022226.

In certain embodiments, the nanowires are dispersed in a liquid and a nanowire layer on the substrate is formed by coating the liquid containing the nanowires onto the substrate and then allowing the liquid to evaporate (dry) or cure. The nanowires are typically dispersed in a liquid to facilitate more uniform deposition onto the substrate by using a coater or sprayer.

Any non-corrosive liquid in which the nanowires can form a stable dispersion (also called "nanowire dispersion") can be used. Preferably, the nanowires are dispersed in water, an alcohol, a ketone, ethers, hydrocarbons or an aromatic solvent (benzene, toluene, xylene, etc.). More preferably, the liquid is volatile, having a boiling point of no more than 200 degrees C. (° C.), no more than 150° C., or no more than 100° C.

In addition, the nanowire dispersion may contain additives or binders to control viscosity, corrosion, adhesion, and nanowire dispersion. Examples of suitable additives or binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., those available under the trade designation Zonyl from DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl FSN, Zonyl FSO, Zonyl FSH, Triton (x100, x114, x45), Dynol (604, 607), n-dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, hydroxy ethyl cellulose. Examples of suitable solvents that may be present in a nanowire dispersion that includes the aforementioned binders or additives, include water and isopropanol.

If it is desired to change the concentration of the dispersion from that disclosed above, the percent of the solvent can be increased or decreased. In preferred embodiments the relative ratios of the other ingredients, however, can remain the same. In particular, the ratio of the surfactant to the viscosity modifier is preferably in the range of about 80:1 to about 0.01:1; the ratio of the viscosity modifier to the nanowires is preferably in the range of about 5:1 to about 0.000625:1; and the ratio of the nanowires to the surfactant is preferably in the range of about 560:1 to about 5:1. The ratios of components of the dispersion may be modified depending on the substrate and the method of application used. The preferred viscosity range for the nanowire dispersion is between about 1 and 1000 cP (0.001 and 1 Pa-s).

The substrate 14 in FIG. 1 can be rigid or flexible. The substrate can be clear or opaque. Suitable rigid substrates include, for example, glass, polycarbonates, acrylics, and the like. Suitable flexible substrates include, but are not limited to: polyesters (e.g., polyethylene terephthalate (PET), polyester naphthalate (PEN), and polycarbonate (PC)), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Optionally, the surface of the substrate can be pre-treated to prepare the surface to better receive the subsequent deposition of the nanowires. Surface pre-treatments serve multiple functions. For example, they enable the deposition of a uniform nanowire dispersion layer. In addition, they can immobilize the nanowires on the substrate for subsequent processing steps. Moreover, the pre-treatment can be carried out in conjunction with a patterning step to create patterned deposition of the nanowires. As described in WO 2007/02226, pre-treatments can include solvent or chemical washing, heating, deposition of an optional patterned intermediate layer to present an appropriate chemical or ionic state to the nanowire dispersion, as well as further surface treatments such as plasma treatment, ultraviolet radiation (UV)-ozone treatment, or corona discharge.

The nanowire dispersion is applied to the substrate at a given thickness, in an effort to achieve desirable optical and electrical properties. This application is performed using known coating methods, such as slot coating, roll coating, Mayer rod coating, dip coating, curtain coating, slide coating, knife coating, gravure coating, notch bar coating or spraying, yielding a conductive nanowire layer on the substrate. This coating step can be performed either as a roll-to-roll process or in a piece-part fashion. Following the deposition, the liquid of the dispersion is typically removed by evaporation. The evaporation can be accelerated by heating (e.g., using a dryer). The resulting conductive nanowire layer may require post-treatment to render it more electrically conductive. This post-treatment can be a process step involving exposure to heat, plasma, corona discharge, UV-ozone, or pressure as further described in WO 2007/02226. Optionally coating the substrate with a nanowire layer can be followed by hardening or curing the nanowire layer.

Optionally, the conductive nanowire layer 16 can be coated onto the substrate 14 by a process wherein the layer is delivered to the substrate surface 15 using means other than liquid dispersion coating. For example, a nanowire layer can be dry-transferred to a substrate surface from a donor substrate. As a further example, nanowires can be delivered to a substrate surface from a gas phase suspension.

In one specific embodiment, a layer of aqueous dispersion of nanowires (for example, dispersions available from Cambrios under the trade designation ClearOhm Ink) was applied to a PET substrate in the range 10.0 to 25 microns thick using a slot die coating technique. The coating formulation (e.g. % total solids by wt. and % silver nanowire solids by wt.) can be selected, along with the coating and drying process conditions, to create a nanowire layer with designed electrical and optical properties, e.g. a desired sheet resistance (Ohm/Sq) and optical properties such as transmission (%) and haze (%).

The conductive nanowire layer 16 that results from coating nanowires on a substrate (e.g., from a nanowire dispersion) includes nanowires and optionally binder or additives. The nanowire layer preferably includes an interconnected network of nanowires. The nanowires that make up the nanowire layer are preferably electrically connected to each other, leading approximately or effectively to a sheet conductor. The nanowire layer includes open space between the individual nanowires that make up the layer, leading to at least partial transparency (i.e., light transmission). Nanowire layers having an interconnected network of nanowires with open space between the individual nanowires may be described as transparent conductor layers.

Typically, the optical quality of the nanowire layer 16 can be quantitatively described by measureable properties including light transmission and haze. "Light transmission" refers to the percentage of an incident light transmitted through a medium. In various embodiments, the light transmission of the conductive nanowire layer is at least 80% and can be as high as 99.9%. In various embodiments, the light transmission of the conductive layer such as the nanowire layer is at least 80% and can be as high as 99.9% (e.g., 90% to 99.9%, 95% to 99.5%, 97.5% to 99%). For a transparent conductor in which the nanowire layer is deposited or laminated (e.g., coated) on a substrate (e.g., a transparent substrate), the light transmission of the overall structure may be slightly diminished as compared with the light transmission of the constituent nanowire layer. Other layers that may be present in combination with the conductive nanowire layer and the substrate, such as an adhesive layer, anti-reflective layer, anti-glare layer, may improve or diminish the overall light transmission of the transparent conductor. In various embodiments, the light transmission of the trans- parent conductor comprising a conductive nanowire layer deposited or laminated on a substrate and one or more others layers can be at least 50%, at least 60%, at least 70%, at least 80%, at least 90%, or at least 91%, and may be as high as at least 91% to 99%.

Haze is an index of light diffusion. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. In accordance with ASTM Standard No. D1003-11, haze can be defined as the proportion of transmitted light that is deflected by an angle greater than 2.5 degrees. In various embodiments, the haze of the conductive nanowire layer is no more than 10%, no more than 8%, no more than 5%, no more than 2%, no more than 1%, no more than 0.5%, or no more than 0.1% (e.g., 0.1% to 5% or 0.5 to 2%). For a transparent conductor in which the conductive nanowire layer is deposited or laminated (e.g., coated) on a substrate (e.g., a transparent substrate), the haze of the overall structure may be slightly increased as compared with the haze of the constituent nanowire layer. Other layers that may be present in combination with the conductive nanowire layer and the substrate, such as an adhesive layer, anti-reflective layer, anti-glare layer, may improve or diminish the overall haze of the transparent conductor comprising a nanowire layer. In various embodiments, the haze of the transparent conductor comprising a conductive nanowire layer deposited or laminated on a substrate can be no more than 10%, no more than 8%, no more than 5%, no more than 2%, no more than 1%, no more than 0.5%, or no more than 0.1% (e.g., 0.1% to 5% or 0.5 to 2%). "Clarity" is the proportion of transmitted light that is deflected by an angle less than 2.5 degrees.

The sheet resistance, transmission, and haze of the conductive nanowire layer 16 can be tailored by varying certain attributes of the layer and its constituent materials such as the nanowires. Regarding the nanowires, they can be varied, for example, in composition (e.g., Ag, Cu, Cu—Ni alloy, Au, Pd), length (e.g., 1 micrometer, 10 micrometers, 100 micrometers, or greater than 100 micrometers), cross-sectional dimension (e.g., diameter of 10 nanometers, 20 nanometers, 30 nanometers, 40 nanometers, 50 nanometers, 75 nanometers, or greater than 75 nanometers). Regarding the conductive layer comprising the nanowires, it can be varied, for example, in its other components (e.g., cellulosic binders, processing aids such as surfactants, or conductance enhancers such as conducting polymers) or its area density of nanowires (e.g., greater than 10 per square millimeter, greater than 100 per square millimeter, greater than 1000 per square millimeter, or even greater than 10000 per square millimeter). Accordingly, the sheet resistance of the conductive layer or nanowire layer may be less than 1,000,000 Ohm/Sq, less than 1,000 Ohm/Sq, less than 100 Ohm/Sq, or even less than 10 Ohm/Sq (e.g., 1 Ohm/Sq to 1,000 Ohm/Sq, 10 Ohm/Sq to 500 Ohm/Sq, 20 Ohm/Sq to 200 Ohm/Sq, or 25 to 150 Ohm/Sq). The transmission of the conductive layer or nanowire layer may be at least 80% and can be as high as 99.9% (e.g., 90% to 99.9%, 95% to 99.5%, or 97.5% to 99%). The haze of the conductive layer or nanowire layer may be no more than 10%, no more than 8%, no more than 5%, no more than 2%, no more than 1%, no more than 0.5%, or no more than 0.1% (e.g., 0.1% to 5% or 0.5 to 2%).

Referring again to FIG. 1, a conductive lead forming material, referred to herein as the conductive interconnect circuit 20, can be electrically connected to the conductive nanowire layer 16 to generate on the substrate 14 one or more first regions 17 of exposed conductive nanowire layer and one or more second patterned regions 22 occupied by the interconnect circuit (for example, a circuit pattern for a touch screen). In some embodiments, the interconnect circuit 20 can be applied to or patterned on the conductive nanowire layer 16, for example, by printing or flexography, and upon being so applied renders the conductive nanowire layer more adherent or protected on the substrate.

The interconnect circuit 20 provides a bridge between the patterned nanowire layer 16 and industry-standard "flex circuitry" or "flexible tails." The interconnect circuit 20 enables the use of simple and "straight" flexible circuits, or tails, versus t-shaped, or flared, tails. This, in turn, enables the potential for finer interconnect circuitry trace and space (and hence tails that can sit behind narrow display bezels) and lowers manufacturing costs. Suitable interconnect circuit materials are described, for example, in U.S. Pat. No. 8,179,381.

Typically, the interconnect circuit 20 is applied to the nanowire layer 16 as a liquid, which can be referred to as a conductive "ink," which includes conductive materials in a liquid carrier (e.g., during application). The liquid carrier can optionally be removed during the application process, for example, before over-coating with additional layers as described below.

In some exemplary embodiments, the conductive ink includes butyl acetate for rapid evaporation in flexographic and rotogravure printing processes. In other embodiments, glycol esters are used when evaporation time is not an issue and screen-printing is employed.

The conductive material in the conductive ink may be silver flakes or spheres, a blend of carbon/graphite particles or a blend of silver flakes/carbon particles. Particle sizes typically range from, for example, about 0.5 microns to about 10.0 microns in diameter. When these flakes or particles are suspended in the polymer binder, they are randomly spaced through the liquid. Once the solvent is evaporated, they condense, forming a conductive path or circuit. Of the conductive materials, silver is the least resistive and the most expensive while carbon/graphite offers the best combination of low resistance and low price. Suitable conductive inks are available from Tekra, Inc., New Berlin, Wis.

In other embodiments, the conductive inks may include metal nanoparticles (for example, silver), in the range of 20 to 500 nm in diameter. The metal nanoparticles are designed to sinter together at modest temperatures (e.g. about 100° C. to about 150° C.), which makes them suitable for processing on a polymeric film. Suitable metal nanoparticle inks are available from PChem Associates, Bensalem, Pa., under the trade designations PFI-722 and PSI-211.

In some embodiments, the conductive ink used to form the interconnect circuit 20 has a dried thickness of about 10 nanometers and 50 micrometers, about 20 nanometers to 1 micrometer, about 50 nanometers and 50 micrometers, or about 50 nanometers to 200 nanometers.

The conductive ink may be cured and/or hardened, or sintered as described, for example, in US 20120177897, into the interconnect circuit 20 in selected regions, forming a pattern over the conductive nanowire layer 16. "Cure or curing" refers to a process where the solvent or liquid carrier is removed from the conductive ink to form a printed interconnect circuit pattern. Suitable curing conditions are well known in the art and include by way of example, heating, irradiating with visible or ultraviolet (UV) light, electron beams, and the like. Alternatively, "harden(s) or hardening" may be caused by solvent removal during drying, for example, without polymerization or cross-linking.

The conductive ink is patterned by a suitable patterning process to form the interconnect circuit 20. Suitable patterning processes include subtractive methods such as photolithography (wherein the resist matrix material is a photoresist). Suitable patterning processes also include direct printing. As discussed above, hardening or curing of the conductive ink preferably occurs prior to the next process step. Suitable printers or patterning methods are known and include the illustrated flexographic printing, gravure printing, ink jet printing, screen printing, spray coating, needle coating, photolithographic patterning, and offset printing.

Suitable interconnect circuit patterns involve features whose smallest dimension, either width or length, are greater than zero micron such as greater than 0.001 micron and less than 1 micron, less than 10 microns, less than 100 microns, less than 1 mm, or less than 10 mm. Any upper bound on the feature size is limited only by the size of the substrate on which printing occurs. In the case of roll-to-roll printing, this is effectively indefinite in the machine direction of the web. These features can take on any shape that can be patterned, such as stars, squares, rectangles, or circles. Often the features will be parallel lines or a grid sensitive to touch for use as a component in a touch screen.

Figure 2:
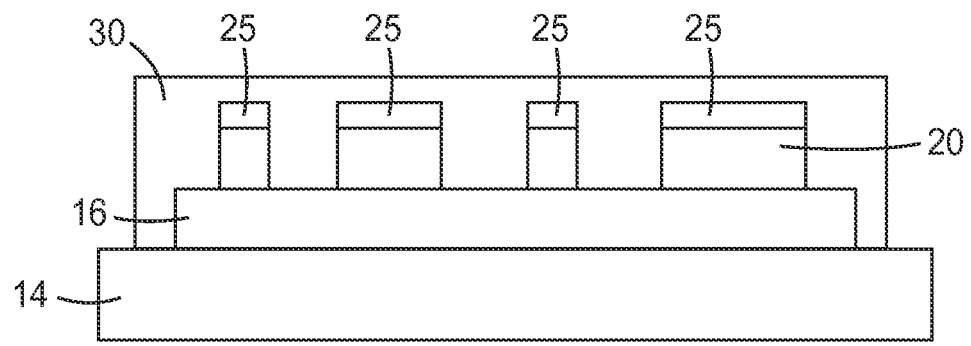
FIG. 2 is a schematic, cross-sectional view of the construction of FIG. 1 at least partially overlain by a strippable polymer layer.

Referring to FIG. 2, an overcoat composition is applied to the patterned interconnect circuit 20 to form a protective overcoat layer 25 thereon. The protective layer 25 may be applied on the interconnect circuit 20 using any suitable coating technique, including, but not limited to, slot coating, coating using a Mayer rod, gravure, evaporative, stamping, vacuum coating and the like.

The overcoat composition used to form the overcoat layer 25 includes one or more organosulfur compounds as described in U.S. Published Application No. 2010/0258968, incorporated herein by reference. In some embodiments, the organosulfur compounds are thiol compounds capable of forming a layer on a selected surface of the interconnect circuit layer 20. The thiols include the —SH functional group, and can also be called mercaptans. Useful thiols include, but are not limited to, alkyl thiols and aryl thiols. Other useful organosulfur compounds include dialkyl disulfides, dialkyl sulfides, alkyl xanthates, dithiophosphates, and dialkylthiocarbamates.

Preferably the overcoat composition from which the protective layer 25 is derived includes alkyl thiols such as, for example, linear alkyl thiols: $HS(CH_2)_nX$, wherein n is the number of methylene units and X is the end group of the alkyl chain (for example, X=—$CH_3$, —OH, —COOH, —$NH_2$, or the like). Preferably, X=—$CH_3$. Other useful functional groups include those described, for example, in: (1) Ulman, "Formation and Structure of Self-Assembled Monolayers," Chemical Reviews Vol. 96, pp. 1533-1554 (1996); and (2) Love et al., "Self-Assembled Monolayers of Thiolates on Metals as a Form of Nanotechnology," Chemical Reviews Vol. 105, pp. 1103-1169 (2005).

Useful alkyl thiols can be linear alkyl thiols (that is, straight chain alkyl thiols) or branched, and can be substituted or unsubstituted. Examples of branched alkyl thiols that are useful include alkyl thiols with a methyl group attached to every third or every fourth carbon atom of a linear alkyl chain backbone (for example, phytanylthiol). Examples of mid-chain substituents within useful alkyl thiols include ether groups and aromatic rings. Useful thiols can also include three-dimensional cyclic compounds (for example, 1-adamantanethiol).

Preferred linear alkyl thiols have 10 to 20 carbon atoms (more preferably, 12 to 20 carbon atoms; most preferably 16 carbon atoms, 18 carbon atoms, or 20 carbon atoms).

Suitable alkyl thiols include commercially available alkyl thiols (Aldrich Chemical Company, Milwaukee, Wis.). Preferably, the overcoat compositions from which the protective layer 25 are derived consist primarily of a solvent and the organosulfur compound, with impurities including less than about 5% by weight of the overcoat composition; or less than about 1%; or less than about 0.1%. Useful overcoat compositions can contain mixtures of different organosulfur compounds dissolved in a common solvent such as, for example, mixtures of alkyl thiol and dialkyl disulfide.

Aryl thiols, which include a thiol group attached to an aromatic ring, are also useful in the overcoat composition giving rise to the protective layer 25. Examples of useful aryl thiols include biphenyl thiols and terphenyl thiols. The biphenyl and terphenyl thiols can be substituted with one or more functional groups at any of a variety of locations. Other examples of useful aryl thiols include acene thiols, which may or may not be substituted with functional groups.

Useful thiols can include linear conjugated carbon-carbon bonds, for example double bonds or triple bonds, and can be partially or completely fluorinated.

The overcoat compositions from which the protective layer 25 is derived can include two or more chemically distinct organosulfur compounds. For example, the overcoat composition can include two linear alkyl thiol compounds, each with a different chain length. As another example, the overcoat composition can include two linear alkyl thiol compounds with different tail groups.

The protective layer 25 may be formed from neat organosulfur compounds, or may be delivered from a solvent-based overcoat composition. In some embodiments the overcoat composition includes more than one solvent, but most useful formulations need include only a single solvent. Overcoat compositions formulated with only one solvent may contain small amounts of impurities or additives, for example stabilizers or desiccants.

Ketones can be suitable solvents for the overcoat compositions giving rise to the protective layer 25. In some embodiments, suitable solvents include, for example, acetone, methyl ethyl ketone, ethyl acetate, and the like, and combinations thereof. The one or more organosulfur compounds (for example, thiol compounds) are present in the solvent in a total concentration of at least about 3 millimoles (mM). As used herein, the "total concentration" refers to the molar concentration of all the dissolved organosulfur compounds taken in aggregate. The one or more organosulfur compounds (for example, thiol compounds) can be present in any total concentration in which the overcoat composition consists of essentially a single phase. The one or more organosulfur compounds (for example, thiol compounds) can be present in total concentrations of at least about 5 mM, at least about 10 mM, at least about 20 mM, at least 50 mM, and even at least about 100 mM.

The protective overcoat layer 25 can be patterned by a suitable patterning process including, but not limited to, subtractive methods such as photolithography, or direct printing. Hardening or curing of the thiol compound layer preferably occurs prior to the next process step. Suitable printers or patterning methods are known and include flexographic printing, gravure printing, ink jet printing, screen printing, spray coating, needle coating, photolithographic patterning, and offset printing.

Suitable protective overcoat layer patterns include features whose smallest dimension, either width or length, are greater than zero micron such as greater than 0.001 micron and less than 1 micron, less than 10 microns, less than 100 microns, less than 1 mm, or less than 10 mm. Any upper bound on the feature size is limited only by the size of the substrate on which printing occurs. In the case of roll-to-roll printing, this is effectively indefinite in the machine direction of the web. These features can take on any shape that can be patterned, such as stars, squares, rectangles, or circles. Often the features will be parallel lines or a grid sensitive to touch for use as a component in a touch screen.

The liquid overcoat composition may be cured and/or hardened to remove any carrier solvent or excess thiol material to form the protective layer 25 in selected regions forming a pattern over the interconnect circuit 20. The liquid overcoat composition is typically dried in an oven, but any suitable drying technique may be used to form the protective layer 25.

When cured or dried, in some embodiments the protective overcoat layer 25 is an optically clear material, which in this application refers to a material with a light transmission of at least 80% in the visible region (400 nm-700 nm). In various embodiments, the protective layer 25 of the organosulfur compound has a thickness of less than about 500 nm, or less than about 100 nm, or less than about 50 nm, or less than about 10 nm, or at least about 1 nm.

Referring again to FIG. 2, after the liquid overcoat composition is cured and/or dried to form the protective overcoat layer 25, a strippable polymer layer-forming composition is applied over the protective overcoat layer 25, the interconnect circuit 20, and the conductive nanowire layer 16 on the substrate 14 (e.g., coated; or patterned, for example by printing, onto a one or more regions of the conductive nanowire layer 16 on the substrate 14). The strippable polymer layer-forming composition, when cured or hardened, forms a strippable polymer layer 30 can be stripped from the substrate 14, and when so removed peels away the conductive nanowire layer 16 from the substrate 14 (e.g., in the one or more regions where the strippable polymer layer 30 is patterned).

Suitable strippable polymer materials for the strippable polymer layer 30 readily coat and adhere to the conductive nanowire layer 16 while not unduly adhering to either the substrate 14, the interconnect circuit 20, or the protective overcoat layer 25, such that the strippable polymer layer 30 can be cleanly peeled from the protective overcoat layer 25, the interconnect circuit 20, and the substrate 14. The selection of chemical composition for the strippable polymer layer 30 depends on the selection of the substrate 14, the interconnect circuit 20, the protective overcoat layer 25, and the specific composition of the conductive nanowire layer 16.

One suitable strippable polymer layer-forming composition includes polyvinyl alcohol (PVA). It has been found in some embodiments that a molecular weight of approximately 8,000 to 9,000 Da for the PVA is preferred. A suitable commercially available coating composition comprising PVA is MacDermid's Print & Peel available from MacDermid Autotype, Inc., Rolling Meadows, Ill. Print and Peel is a water based screen printable varnish designed to be selectively printed onto a range of surface finishes to act as an easily removable protective mask. Surprisingly, it was found that the adhesion of this composition to the nanowire layer 16 was sufficient to completely remove it from the substrate 14 in unwanted areas while readily leaving the nanowire areas covered by the interconnect circuit pattern 20 attached to the substrate 14 during the subsequent peeling operation.

Another commercially available polymer material suitable for the strippable polymer-forming composition is Nazdar 303440WB Waterbase Peelable Mask available from Nazdar Ink Technologies, Shawnee, Kans. Another suitable material for the strippable polymer layer-forming composition can be formulated by mixing poly vinyl alcohol (PVA) and Triton X-114 available from Union Carbide (or another suitable surfactant) and deionized water. One suitable formulation can include 20% by weight PVA (8,000 to 9,000 Da molecular weight), 2% by weight Triton X-114, and the balance deionized water.

In some embodiments, the strippable polymer layer-forming composition can include the one or more organosulfur compounds as described in U.S. Published Application No. 2010/0258968 for use in the protective layer 25. If the organosulfur compound is incorporated into the strippable polymer layer-forming composition, application of the protective layer forming composition is not required, and removal of the strippable polymer layer 30 leaves behind a protective layer of the organosulfur compound on the interconnect circuit layer 20. In various embodiments, the protective layer 25 of the organosulfur compound remaining following removal of the strippable polymer layer 30 has a thickness of less than about 500 nm, or less than about 100 nm, or less than about 50 nm, or less than about 10 nm, or at least about 1 nm.

Preferably, the strippable polymer layer-forming composition is applied in a liquid state. The strippable polymer layer 30 is formed by applying a strippable polymer layer-forming liquid composition on the protective overcoat layer 25 (if present), the interconnect circuit 20, the nanowire layer 16, and the substrate 14. A dryer can be optionally used to harden or cure the strippable polymer layer-forming composition after application by a coater. The strippable polymer layer-forming composition can be applied to the substrate using known application methods, such as slot coating, gravure coating, roll coating, flood coating, notch bar coating, spraying, thermal compression lamination, or vacuum lamination.

As shown in FIG. 1, a major surface of the substrate 15 having a conductive nanowire layer 16 and the interconnect circuit pattern 20 includes: i) one or more first regions 17 of exposed conductive nanowire layer 16 and ii) one or more second regions 22 of conductive nanowire layer overlain by the interconnect circuit 20. Generally, the second regions 22 overlain by the interconnect circuit 20 are raised with respect to the exposed conductive nanowire layer regions 17. Generally, at the border between the interconnect circuit regions 22 and the exposed nanowire layer regions 17, a change in relief exists. An example of such a change in relief is a step edge between the first exposed nanowire regions 17 and the second interconnect circuit regions 22. The step edge may have a height (as approximated by the thickness of the interconnect circuit layer 20) and it may have a lateral extent (e.g., distance, approximately in a plane parallel to the substrate, over which the step edge exists). Depending upon the change in relief, and depending upon the in-plane geometries of the second interconnect circuit regions 22 and the first exposed nanowire regions 17 (e.g., shapes and sizes), making contact to substantially the entire exposed nanowire with the strippable polymer layer-forming composition may be challenging. If a portion of the exposed conductive nanowire layer region 17 is not contacted by the strippable polymer layer 30, that portion may not be removed successfully or with high pattern fidelity, during the subsequent peeling step described below. Accordingly, in some embodiments, the strippable polymer-forming liquid composition is applied to the interconnect circuit patterned substrate, wherein at least 50%, preferably at least 75%, more preferably at least 90%, more preferably at least 95%, more preferably at least 99%, and most preferably 100% of the exposed nanowire layer 17 is contacted by the strippable polymer layer material.

The strippable polymer layer-forming composition may be a polymer solution, a polymer dispersion, a monomer solution, a monomer, a mixture of monomers, or a melt. The composition may include minor amounts of secondary components (e.g., photoinitiators, surface active agents, viscosity modifiers). The strippable polymer layer 30 is not delivered as a solid (e.g., a viscoelastic solid, such as a cross-linked pressure sensitive adhesive exhibiting appreciable yield stress that would limit the degree of contact between the adhesive and the exposed conductive or nanowire material in the exposed nanowire material regions). Application of the strippable layer in a liquid state leads to high resolution (high fidelity) patterning of the conductive or nanowire layer 16 after peeling the strippable polymer layer 30.

The viscosity of the strippable polymer layer-forming liquid composition can be selected with consideration of the application method that will be used to deliver it to the conductive ink patterned substrate. For example, for slot coating, roll coating, flood coating, notch bar coating, or spraying of a polymer solution, monomer, or monomer solution: the viscosity can be between 1 cps and 10,000 cps (0.001 and 10 Pa-s), preferably between 10 cps and 2,500 cps (0.01 and 2.5 Pa-s). For thermal compression or vacuum lamination of a polymer melt, the viscosity may be between 10,000 cps and 100,000,000 cps (10 Pa-s and 100 Pa-s). The strippable polymer layer-forming liquid composition preferably has zero yield stress. Some useful strippable polymer layer-forming liquids may develop a very low yield stress, preferably less than 100 Pa, more preferably less than 50 Pa, even more preferably less than 5 Pa, even more preferably less than 1 Pa.

The strippable polymer layer 30 is substantially continuous over at least a portion of the major surface of the substrate 14 and desirably over at least 50%, 60%, 70%, 80%, or 90% of the area of the major surface 15. The strippable polymer layer-forming liquid may be applied in discrete blocks or rectangles leaving uncoated substrate areas between them with the blocks or rectangles having a size similar to the overall size of the intended touch screen being produced.

The approach described here has several advantages. First, by casting the strippable polymer layer 30 from a liquid, it is possible to create very intimate contact between the strippable polymer layer 30 and the conductive nanowire layer 16. Second, this intimate contact prevents removed portions of the conductive nanowire layer 16 from falling onto the substrate surface 15 after the strippable polymer layer is removed, avoiding contamination of the substrate 14 that could substantially decrease product yields. Finally, after the over coating step with the strippable polymer-forming liquid composition, the cured or hardened strippable polymer layer 30 can remain in place during transportation, handling, and converting operations, serving as a protective film and eliminating the need for an additional liner to be applied after the fact, which could be the case if the conductive nanowire material 16 were patterned using laser ablation.

The strippable polymer layer has a sufficient thickness to cover both the overcoat layer protected interconnect circuit 20 and the conductive nanowire layer 16. Typical thicknesses for the strippable polymer layer 30 are from about 2 µm to about 10 µm, or from 10 µm to 25 µm, or from 25 µm to 100 µm. After applying the strippable polymer layer-forming liquid composition, the strippable polymer layer 30 is hardened or cured as needed. An optional dryer can be used to speed up the hardening or curing process. A thinner layer of strippable polymer material is preferred, since it requires less energy to remove the solvent from the strippable polymer-forming liquid composition, leading to faster drying, and therefore, processing times. However, a minimum dried thickness of strippable polymer is necessary to maintain a stable film during the peeling step.

Figure 3:
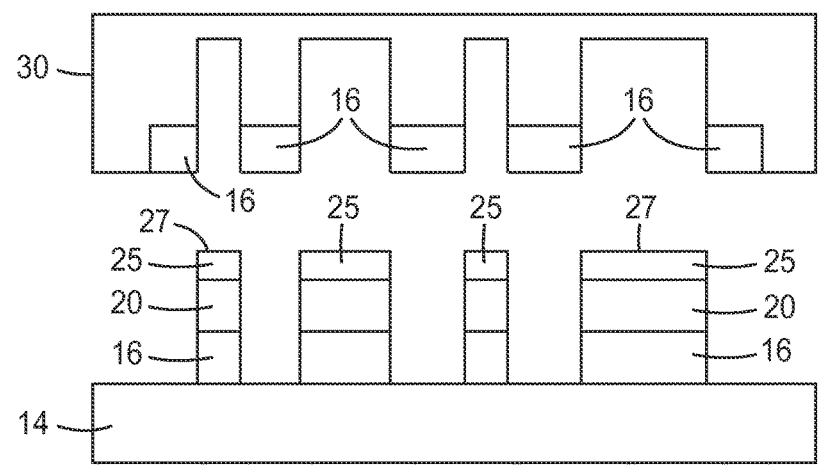
FIG. 3 is a schematic, cross-sectional view of the construction of FIG. 2 following removal of the strippable polymer layer.

Referring now to FIG. 3, the strippable polymer layer 30 is peeled away. The strippable polymer layer 30 may be removed by a wide variety of techniques such as, for example, by passing the substrate 14 with all of the applied layers though a delaminating nip (not shown in FIG. 3). The strippable polymer layer 30 with attached conductive nanowire material 16 in areas of the substrate unprotected by the patterned (e.g., printed) interconnect circuit 20 is removed from the substrate 14. Peeling the strippable polymer layer 30 from the substrate 14 removes the conductive nanowire material 16 in selected regions of the substrate 14 thereby forming a patterned nanowire layer in which each region of the nanowire layer remaining on the substrate 14 is overlain by the interconnect circuit layer 20, which in turn is overlain by the protective overcoat layer 25.

While not wishing to be bound by any theory, presently available evidence indicates that the protective overcoat layer 25 acts as a release coating to protect the interconnect circuit 20 as the strippable polymer layer 30 and the conductive nanowire material 16 are removed from the substrate 14. Without the protective overcoat layer 25, conductive materials in the interconnect circuit 20 can adhere to the strippable polymer layer 30 and break away from the interconnect circuit 20. The protective overcoat layer 25 prevents the removal and subsequent loss of conductive material from the interconnect circuit layer 20, which preserves the integrity of the interconnect circuit 20. The protective overcoat layer 15 also prevents undesirable corrosion of the interconnect circuit 20, both before and after the strippable polymer layer 30 is removed.

Figure 4:
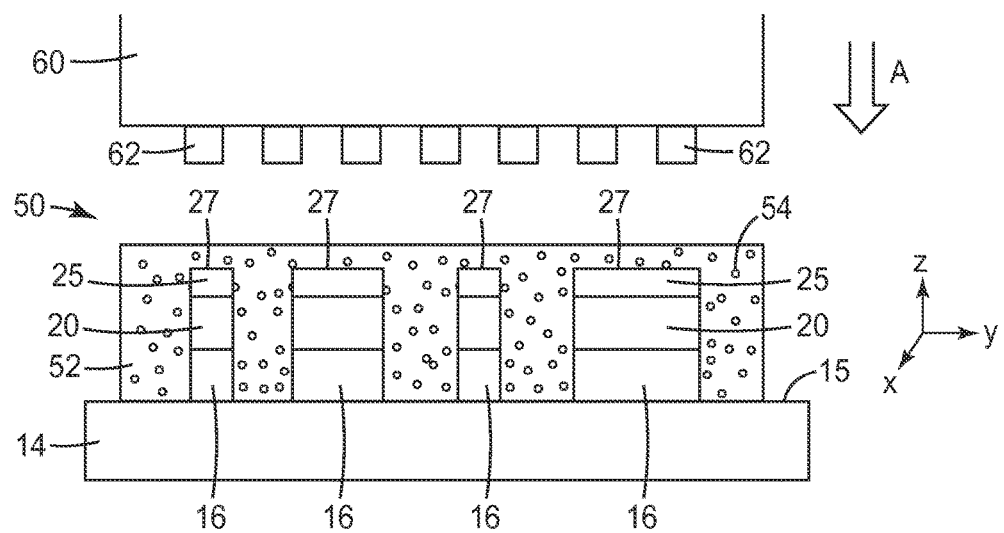
FIG. 4 is a schematic, cross-sectional view of the construction of FIG. 3 having applied thereon a conductive adhesive in preparation for bonding to an electronic component.

Referring now to FIG. 4, a layer of an optional conductive material 50 is applied to the patterned conductive nanowire layer 16, which is electrically connected to the patterned interconnect circuit 20. The interconnect circuit 20 is protected by the protective overcoat layer 25. Any suitable conductive material 50 may be used including, but not limited to, indium tin oxide (ITO), transparent oxides, conductive mesh, PEDOT, conductive adhesives, and the like.

In some embodiments, the layer of conductive material 50 includes an adhesive matrix 52 with conductive materials 54. The conductive materials 54 include, but are not limited to, metal particles or scrim of silver, gold, copper, aluminum and the like, and mixtures thereof.

The conductive materials 54 may provide conductivity through the adhesive matrix 52 along the z direction as shown in FIG. 4, or optionally along the x, y and z directions. In some embodiments, the conductive materials 54 in the adhesive layer 50 contact nanowires (not shown in FIG. 4) protruding from the conductive nanowire layer 16 and/or the interconnect circuit 20 and form an electrical interconnection with the nanowires in the conductive layer 16.

The conductive adhesive layer 50 may vary widely, but in some embodiments includes, but is not limited to, anisotropically conductive films available from 3M, St. Paul, Minn., under the trade designations 3M Anisotropically Conductive Film 5363, 7303, 7371, 7376, and 7379. These films include an adhesive matrix having therein with conductive particles. In some embodiments, the adhesive matrix is selected from an acrylate adhesive, an epoxy adhesive, a silicone adhesive, or a mixture or combination thereof. In various embodiments, the conductive particles include, but are not limited to, silver, gold, copper, aluminum and the like, and mixtures thereof, as well as other metals or nonconductive particles (for example, polymers) having a conductive coating made from, for example, silver, gold, copper, aluminum, and mixtures and combinations thereof.

In some embodiments, the conductive adhesives have a thickness of about 10 microns to about 50 microns, and are supplied on a strippable liner. Once the liner is removed, the conductive adhesive can be bonded to an electronic component with heat, pressure or a combination thereof. In some embodiments, the conductive adhesives can be bonded at a temperature of about 140° C. to about 170° C. under a bonding pressure of about 1-2 MPa.

In another embodiment, the conductive adhesive layer is a conductive transfer tape. A first major surface of the transfer tape is coated with a layer of a first conductive adhesive such as described above, and a second opposed side of the transfer tape is coated with a layer of a second conductive adhesive such as described above, which may be the same or different from the first conductive adhesive. Examples of suitable conductive transfer tapes include, but are not limited to, those available from 3M, St. Paul, Minn., under the trade designations 3M Electrically Conductive Adhesive Transfer Tape 8703, 9703, 9704 and 9705. These Adhesive Transfer Tapes include acrylic pressure sensitive adhesive matrices loaded with silver particles, and may conduct through the adhesive matrix along the z direction.

In various exemplary embodiments, these transfer tapes have a thickness of about 0.05 mm to about 0.55 mm, about 0.05 mm to about 0.10 mm, or about 0.05 mm to about 0.127 mm.

Referring again to FIG. 4, an electronic component 60 including metal contacts 62 (for example, conductive pads) may be moved along the direction of the arrow A toward mating surfaces 27 of the protective layer 25. The electronic component may vary widely depending on the intended application, and in some embodiments includes a flexible circuit, a printed circuit board (PCB), a glass panel, or a pattern of wires.

Figure 5:
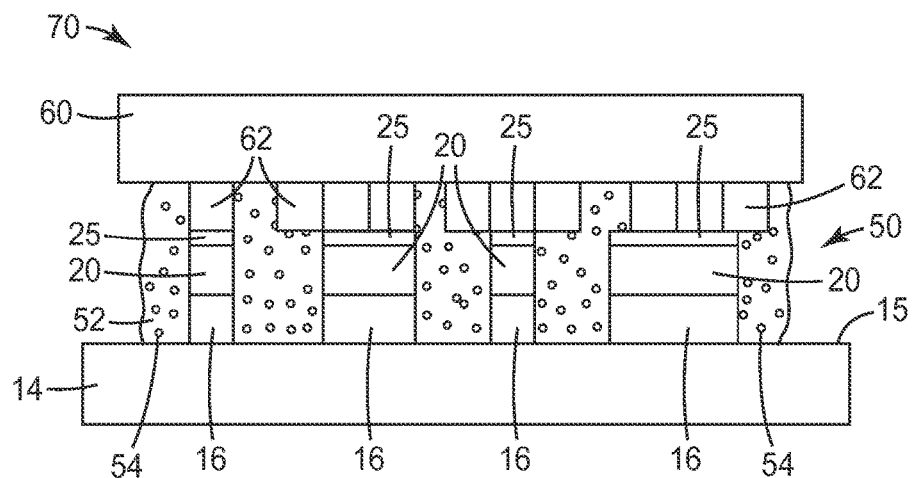
FIG. 5 is a schematic, cross-sectional view of a laminate construction including the construction of FIG. 4 bonded to the electronic component.

The contacts 62 on the electronic component 60 engage the mating surfaces of 27 of the protective layer 25 to form an electronic assembly construction 70 as shown in FIGS. 4-5. The electronic assembly 70 includes a substrate 14 having on a surface 15 thereof a conductive layer 16 including nanowires (not shown in FIG. 5). The conductive nanowire layer 16 is electrically connected to a patterned interconnect circuit 20, which in turn is at least partially overlain by the protective layer 25.

In some embodiments, the nanowires in the nanowire layer 16 contact the conductive materials 54 in the optional conductive adhesive layer 50, and the adhesive matrix 52 bonds the electronic component 60 to the substrate 14 to form a laminate construction. In some embodiments, the conductive materials 54 in the conductive adhesive layer 50 also contact the metal contacts 62 on the electronic component 60, which enhances the electrical interconnection between the electronic component 60 and the conductive layer 16.

While not wishing to be bound by any theory, presently available evidence indicates that the protective layer 25 may be sufficiently thin to allow an electrical signal to propagate across the protective layer 25 from the contact 62 to the electrical interconnect circuit 20. Again, not wishing to be bound by any theory, in other embodiments, the contacts 62 may penetrate some areas of the protective layer 25 and directly engage the interconnect circuit 20 to allow an electrical signal to propagate directly from the contact 62 to the interconnect circuit 20.

Figure 6:
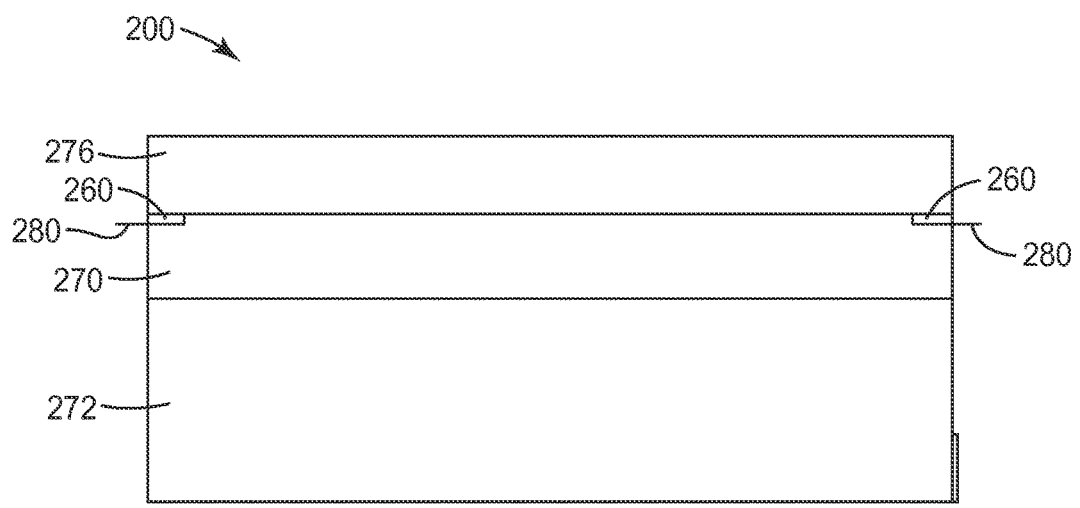
FIG. 6 is a schematic, cross-sectional view of a touch-screen display.

Referring to FIG. 6, an example of a touch-screen assembly 200 includes a LCD layer 272 adjacent to a layer of glass 214. The layer of glass 214 serves as a substrate for an electronic assembly 270 such as, for example, the assembly shown in FIG. 5. The electronic assembly construction 270 is electrically connected to flexible circuits 260 via the interconnect circuit 20, which in turn is at least partially overlain by the protective layer 25 (see FIG. 5). Electrical traces 280 on the flexible circuits 260 connect the assembly 200 to components of a display device such as a computer, mobile phone, tablet, and the like. A flexible transparent surface 276 overlying the electronic assembly construction 270 serves as the point of interaction with a user of the display device.

EXAMPLES

Example 1

Nanosilver interconnects were printed on a 5 mil polyethylene terephthalate (PET) substrate (DuPont Melinex ST-504) coated with a silver nanowire solution on the primed side of the film.

The nanowire solution was a mixture of 95% by weight ClearOhm Ink from Cambrios Technologies Corporation and 5% by weight isopropyl alcohol from Sigma Aldrich. The nanowire solution was coated 13 inches (33 cm) wide using a slot die at the 3M Cumberland, Wis. facility. A wet film thickness of 15 microns was targeted for a web speed of 40 fpm.

An interconnect circuit was printed with PFI-722 nanosilver flexographic ink from PChem, Associates using a 3 BCM, 900 lpi anilox roll at 50 fpm. The nanosilver ink was dried using one IR unit scaled to 100% at 50 fpm and two Flexair air impingement dryers in series, each with six drying bars. Both dryers were set at an air temperature of 275° F. and a manifold supply pressure of 15 psi. The printed interconnect circuit pattern consisted of two interconnects oriented in the downweb direction with fifty-two and fifty-one connections, respectively, in addition to contact pads corresponding to each connection. The interconnect circuit had a 300 micron pitch, with 100 micron connection lines and 200 micron spaces between. The photopolymer flexographic printing plate used to make the interconnect circuit was made by Southern Graphics Systems (SGS).

Thiol (1-hexadecanethiol from TCI America) was applied to samples of the printed nanosilver film by gently wiping a cloth saturated with the thiol across the surface of the interconnect circuit. After allowing the thiol to dry, each sample was coated with a print & peel formulation to make a strippable polymer layer. This formulation consisted of 97% by weight McDermid Print and Peel and 3% by weight Dawn dish soap (citrus). Each sample was over-coated with this formulation using a #8 Mayer rod and placed in a batch oven at 100° C. for 2 minutes, after which they were removed and allowed to cool for 5 minutes. After cooling, the strippable polymer layer was removed from the film and the nanosilver print condition was evaluated.

To test if the thiol successfully protected the interconnect circuit from stripping, a multimeter was used to test interconnect resistance. Interconnects without a thiol coating contained no shorts but typically had multiple open connections and higher resistance for traces that were still conductive. Interconnects coated with thiol were shown to be conductive and also weren't shorted, indicating the Print and Peel formulation was still able to strip the nanowire material located between each interconnect connector.

Figure 7:
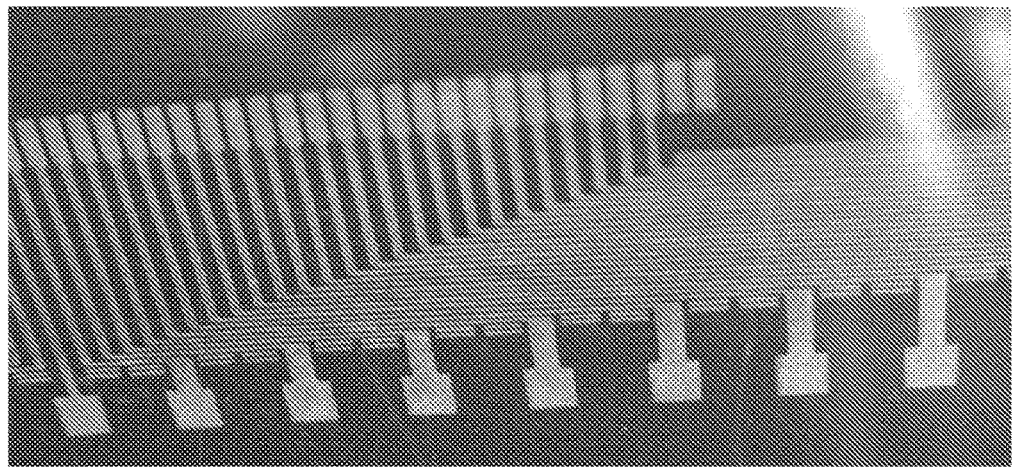
FIG. 7 is an image of a patterned interconnect circuit layer without a protective overcoat layer, following removal of a strippable polymer layer.

FIG. 7 is an image of an interconnect circuit following removal of the strippable polymer layer. The interconnect circuit in FIG. 7 was unprotected by a thiol protective coating, and it was observed that portions of the interconnect pattern were stripped away along with the strippable polymer layer.

Figure 8:
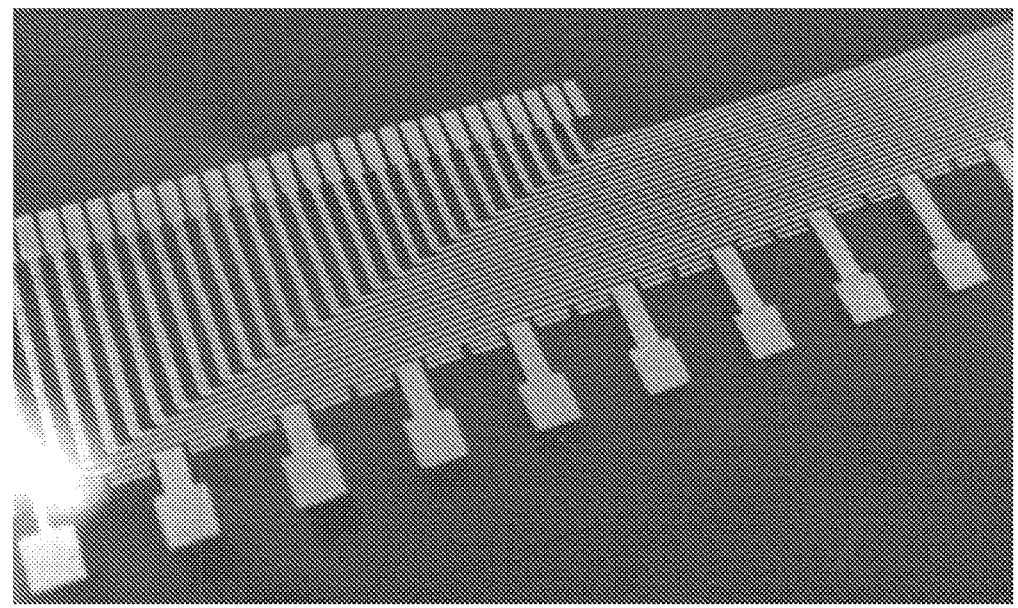
FIG. 8 is an image of patterned interconnect circuit layer with a protective overcoat layer, following removal of a strippable polymer layer.

FIG. 8 is an image of an interconnect circuit following removal of the strippable polymer layer. The interconnect circuit in FIG. 8 was protected by a thiol protective coating, and it was observed that the interconnect pattern remained substantially intact following removal of the strippable polymer layer.

Example 2

Nanosilver interconnects were printed on a 5 mil polyethylene terephthalate (PET) substrate (DuPont Melinex ST-504) coated with a silver nanowire solution on the primed side of the film.

The nanowire solution was a mixture of 95% by weight ClearOhm Ink from Cambrios Technologies Corporation and 5% by weight isopropyl alcohol from Sigma Aldrich. The nanowire solution was coated 13 inches (33 cm) wide using a slot die at the 3M Cumberland, Wis. facility. A wet film thickness of 15 microns was targeted for a web speed of 40 fpm.

An interconnect circuit was printed with PFI-722 nanosilver flexographic ink from PChem Associates using a 3 BCM, 900 lpi anilox roll at 50 fpm. The nanosilver ink was dried using one IR unit scaled to 100% at 50 fpm and two Flexair air impingement dryers in series, each with six drying bars. Both dryers were set at an air temperature of 275° F. and a manifold supply pressure of 15 psi.

The printed interconnect circuit pattern consisted of two interconnects oriented in the downweb direction with fifty-two and fifty-one connections, respectively, in addition to contact pads corresponding to each connection. The interconnect circuit had a 300 micron pitch, with 100 micron connection lines and 200 micron spaces between. The photopolymer flexographic printing plate used to make the interconnect circuit was made by Southern Graphics Systems (SGS).

Thiol (1-hexadecanethiol from TCI America) was added to a formulation of strippable polymer that consisted of 97% by weight Print and Peel and 3% by weight Dawn dish soap (citrus). To this strippable polymer formulation, 3% by weight of thiol was added. Each sample was over-coated with this thiol modified strippable polymer formulation using a #8 Mayer rod and placed in a batch oven at 100° C. for 2 minutes, after which they were removed and allowed to cool for 5 minutes. After cooling, the strippable polymer layer was removed from the film and the nanosilver print condition was evaluated.

To test if the thiol successfully protected the interconnect circuit from stripping, a multimeter was used to test interconnect resistance. Interconnects coated the standard strippable polymer contained no shorts but typically had multiple open connections and higher resistance for traces that were still conductive. Interconnects coated with the thiol modified strippable polymer were shown to be conductive and also were not shorted. This indicated the thiol modified formulation was still able to strip the nanowire material located between each interconnect connector and did not strip the nanosilver interconnect.

Various embodiments of the invention have been described. These and other embodiments are within the scope of the following claims.

The invention claimed is:

1. A method for making an electronic assembly, comprising:
applying a protective layer comprising an organosulfur compound to at least a portion of a patterned conductive interconnect circuit, wherein the conductive interconnect circuit is electrically connected to a conductive layer on a substrate, and wherein the conductive layer comprises nanowires and a conductive adhesive comprising an adhesive matrix selected from an acrylate adhesive, an epoxy adhesive, a silicone adhesive, or a combination thereof; and a conductive material selected from metal particles or a scrim comprising silver, gold, copper, aluminum, or a mixture thereof; and
engaging an electrical contact of an electronic component with the protective layer to electrically connect the electronic component and the patterned conductive layer.

2. The method of claim 1, wherein the organosulfur compound is selected from at least one of alkyl thiols and aryl thiols.

3. The method of claim 1, wherein the organosulfur compound is an alkyl thiol.

4. The method of claim 1, wherein the patterned conductive layer is transparent.

5. An electronic assembly made according to the method of claim 1.

6. A method, comprising:
coating a substrate with a conductive layer comprising nanowires and a conductive adhesive comprising an adhesive matrix selected from an acrylate adhesive, an epoxy adhesive, a silicone adhesive, or a combination thereof; and conductive material selected from metal particles or a scrim comprising silver, gold, copper, aluminum, or a mixture thereof;
applying a pattern of a conductive interconnect material on the conductive layer to generate on the substrate one or more first regions of exposed conductive layer and one or more second regions of conductive interconnect material;
hardening or curing the conductive interconnect material to form a patterned interconnect circuit;
applying on at least a portion of the patterned interconnect circuit a protective layer forming composition comprising an organosulfur compound;
overcoating the patterned interconnect circuit and the protective layer forming composition with a liquid strippable polymer layer-forming composition;
hardening or curing the strippable polymer layer-forming composition to form a strippable polymer layer;
peeling the strippable polymer layer from the substrate; and
removing the exposed conductive layer from the substrate in the one or more first regions of the substrate to form a patterned conductive layer on the substrate, wherein the patterned conductive layer is at least partially overlain by the patterned interconnect circuit, and the patterned interconnect circuit is at least partially overlain by the protective layer.

7. The method of claim 6, further comprising drying the protective layer-forming composition to form a protective layer prior to overcoating with the strippable polymer layer forming composition.

8. A method, comprising:
coating a substrate with a conductive layer comprising nanowires and a conductive adhesive comprising an adhesive matrix selected from an acrylate adhesive, an epoxy adhesive, a silicone adhesive, or a combination thereof; and a conductive material selected from metal particle or a scrim comprising silver, gold, copper, aluminum, or mixture thereof;
applying a pattern on the conductive layer with a conductive interconnect material to generate on the substrate one or more first regions of exposed conductive layer and one or more second regions of conductive interconnect material;
hardening or curing the conductive interconnect material to form a patterned interconnect circuit;
overcoating the pattern with a liquid strippable polymer layer-forming composition, wherein the strippable polymer layer-forming composition comprises an organosulfur compound;
hardening or curing the strippable polymer layer-forming composition to form a strippable polymer layer;
peeling the strippable polymer layer from the substrate; and
removing the exposed conductive layer from the substrate in the one or more first regions of the substrate to form a patterned conductive layer on the substrate, wherein the patterned conductive layer is at least partially overlain by the patterned interconnect circuit, and the patterned interconnect circuit is at least partially overlain by a protective layer comprising the organosulfur compound.

9. An electronic assembly, comprising:
a substrate comprising thereon a pattern of conductive nanowires, wherein the conductive nanowires are electrically connected to a conductive interconnect circuit, and wherein at least a portion of the conductive interconnect circuit is overlain by a protective layer comprising an organosulfur compound;
an electrical contact of an electronic component in contact with the protective layer; and
a conductive layer comprising a conductive adhesive comprised of an adhesive matrix selected from an acrylate adhesive, an epoxy adhesive, a silicone adhesive, or a combination thereof; and a conductive material selected from metal particles or a scrim comprising silver, gold, copper, aluminum, or a mixture thereof, between the substrate and the electronic component.

10. The electronic assembly of claim 9, wherein the electronic component comprises a flexible circuit.

11. The electronic assembly of claim 9, wherein the organosulfur compound is selected from at least one of alkyl thiols and aryl thiols.

12. The electronic assembly of claim 9, wherein the organosulfur compound is an alkyl thiol.

13. A touch screen display comprising:
a liquid crystal display; and
an electronic assembly comprising:
a glass substrate on the liquid crystal display, wherein the glass substrate comprises thereon a pattern of conductive nanowires, wherein the conductive nanowires are electrically connected to a patterned conductive interconnect circuit, and wherein at least a portion of the interconnect circuit is overlain by a protective layer comprising an organosulfur compound; and an electrical contact of a flexible circuit in contact with the protective layer;

a conductive layer comprising a conductive adhesive comprised of an adhesive matrix selected from an acrylate adhesive, an epoxy adhesive, a silicone adhesive, or a combination thereof; and a conductive material selected from metal particles or a scrim comprising silver, gold, copper, aluminum, or a mixture thereof, between the glass substrate and the flexible circuit; and a flexible transparent surface overlying the electronic assembly.

14. The display of claim 13, wherein the organosulfur compound is selected from at least one of alkyl thiols and aryl thiols.

15. The display of claim 14, wherein the organosulfur compound is an alkyl thiol.

* * * * *

UNITED STATES PATENT AND TRADEMARK OFFICE
CERTIFICATE OF CORRECTION

PATENT NO. : 10,362,685 B2
APPLICATION NO. : 15/025696
DATED : July 23, 2019
INVENTOR(S) : Ann Gilman Page 1 of 1

It is certified that error appears in the above-identified patent and that said Letters Patent is hereby corrected as shown below:

In the Specification

Column 13
Line 61, After "nanowire" insert -- region 17 --.

In the Claims

Column 19
Line 45, In Claim 6, after "and" insert -- a --.

Column 20
Line 15, In Claim 8, delete "particle" and insert -- particles --, therefor.
Line 16, In Claim 8, after "or" insert -- a --.

Signed and Sealed this
Seventh Day of July, 2020

Andrei Iancu
*Director of the United States Patent and Trademark Office*